United States Patent
Moon et al.

(10) Patent No.: US 7,049,881 B2
(45) Date of Patent: May 23, 2006

(54) INTERNAL VOLTAGE GENERATING CIRCUIT

(75) Inventors: Byong-Mo Moon, Seoul (KR); Tae-Sung Lee, Seoul (KR); Dae-Hwan Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/799,023

(22) Filed: Mar. 9, 2004

(65) Prior Publication Data

US 2004/0217804 A1    Nov. 4, 2004

(30) Foreign Application Priority Data

Mar. 20, 2003    (KR)    ............... 10-2003-0017598

(51) Int. Cl.
*G05F 1/10*    (2006.01)
(52) U.S. Cl. ............... 327/541; 327/540; 626/316
(58) Field of Classification Search ............... 327/540, 327/541, 543; 323/313, 316
See application file for complete search history.

(56) References Cited

U.S. PATENT DOCUMENTS

| | | | | |
|---|---|---|---|---|
| 4,683,382 A | * | 7/1987 | Sakurai et al. | ............... 327/544 |
| 5,721,485 A | * | 2/1998 | Hsu et al. | ................ 713/323 |
| 5,910,924 A | * | 6/1999 | Tanaka et al. | ............. 365/226 |
| 6,184,744 B1 | * | 2/2001 | Morishita | ................... 327/541 |
| 2002/0136065 A1 | * | 9/2002 | Messager | ............... 365/189.09 |

* cited by examiner

*Primary Examiner*—Terry D. Cunningham
(74) *Attorney, Agent, or Firm*—F. Chau & Associates LLC

(57) ABSTRACT

A circuit comprises a comparing means for comparing an internal voltage to a reference voltage for outputting a first driving signal, an internal voltage driving means for outputting the internal voltage in response to the first driving signal; an internal voltage detecting means for detecting the internal voltage and for generating a second driving signal in response to an active signal, and an overdriving control means for controlling the first driving signal in response to the second driving signal.

22 Claims, 9 Drawing Sheets

US 7,049,881 B2

INTERNAL VOLTAGE GENERATING CIRCUIT

BACKGROUND OF THE INVENTION

This patent application claims the priority of Korean Patent Application 2003-17598 filed on Mar. 20, 2003 in the Korean Intellectual Property Office, the entire contents of which are hereby incorporated by reference.

1. Technical Field

The present disclosure relates to a semiconductor memory device, more particularly to an internal voltage generating circuit of a semiconductor memory device.

2. Discussion of the Related Art

An internal voltage generating circuit of a conventional semiconductor memory device includes an internal voltage generating circuit for a memory cell array and an internal voltage generating circuit for a peripheral circuit of the memory cell array.

The internal voltage generating circuit for the memory cell array supplies an internal voltage to a positive channel metal oxide semiconductor (PMOS) bit line sense amplifier which senses a voltage of a bit line and amplifies it to an internal voltage level.

The internal voltage generating circuit for the memory cell array of the conventional semiconductor memory device includes an overdriving transistor in order to prevent a drop of an internal voltage generated when a bit line sensing operation is performed. The internal voltage level rises before the bit line sensing operation is performed and, thus a level drop of an internal voltage is prevented when the bit line sensing operation is performed. Hence, the bit line can be rapidly amplified to an internal voltage level, so that read and write speeds are not delayed.

FIG. 1 is a circuit diagram illustrating a conventional internal voltage generating circuit. The internal voltage generating circuit 10 includes a comparator 11, a negative channel metal oxide semiconductor (NMOS) transistor N1, and a PMOS transistor P1.

In FIG. 1, the NMOS transistor N1 is an overdriving control transistor for controlling overdriving of the PMOS transistor P1, and the PMOS transistor P1 is a driver for driving an internal voltage VCCA. "VREFA" represents a reference voltage for an internal voltage VCCA, "VEXT" represents an external power voltage which is applied from an external portion of a semiconductor memory device, "PACT" represents an active signal and a pulse signal which has a predetermined pulse width generated before an active command is applied to a semiconductor memory device and the bit line sensing operation is performed.

In operation, when an active signal PACT having a "low" level is applied to turn off the NMOS transistor N1 of the internal voltage generating circuit 10 of FIG. 1, the PMOS transistor P1 performs a normal driving operation. In contrast, when an active signal PACT having a "high" level is applied to turn on the NMOS transistor N1, the PMOS transistor P1 performs an overdriving operation.

When the internal voltage VCCA is lower than the reference voltage VREFA during a normal driving operation, the comparator 11 compares the internal voltage VCCA to the reference voltage VREFA and then lowers a voltage of a node A. As a result, a driving ability of the PMOS transistor P1 is increased and then the internal voltage VCCA increases.

On the other hand, when the internal voltage VCCA is higher than the reference voltage VREFA during a normal driving operation, the comparator 11 compares the internal voltage VCCA to the reference voltage VREFA and then increases a voltage of a node A. As a result, a driving ability of the PMOS transistor is decreased and then the internal voltage VCCA decreases.

The internal voltage generating circuit repeatedly performs the operations described above during a normal driving operation to maintain the internal voltage VCCA at the same level as the reference voltage VREFA.

During an overdriving operation, the NMOS transistor N1 is turned on to lower a voltage level of a node A less than during a normal driving operation. As a result, a driving ability of the PMOS transistor P1 is improved when compared with a normal driving operation to overdrive a level of the internal voltage VCCA to a level higher than the reference voltage VREFA.

However, when an external power voltage VEXT increases, a voltage difference between a gate and a source of the PMOS transistor P1 becomes greater, so that a driving ability of the PMOS transistor P1 is more improved than needed, whereby a level of the internal voltage VCCA is overshot. That is, the internal voltage VCCA is much higher than a desired voltage (hereinafter, target voltage) for overdriving.

When the internal voltage VCCA is overshot or higher than a target voltage, a bit line voltage level also becomes higher. As a result, a sensing time is delayed during write and read operations, leading to a delay in data write and read speed.

FIG. 2 is a graph illustrating a variation of an internal voltage VCCA with respect to an active signal PACT in the conventional internal voltage generating circuit 10. A solid line represents performance of an overdriving operation, and a dotted line represents an occurrence of overshooting, wherein the internal voltage VCCA is higher than a target voltage.

As shown in FIG. 2, in the case that an active signal PACT having a predetermined pulse width is generated, when an external voltage VEXT of a low level is applied, an internal voltage VCCA which maintains a level of a reference voltage VREF is overdriven by an amount equal to a voltage $\Delta$, and reaches a target voltage VREF+$\Delta$, as shown by the solid line. However, as shown by the dotted line, when an external voltage VEXT of a high level is applied, an internal voltage VCCA increases to a voltage level beyond a target voltage VREFA+$\Delta$. Hence, during a bit line sensing operation, a level of an internal voltage VCCA does not decrease to reach a level of the reference voltage VREFA and instead maintains a voltage level higher than VREFA, that is, VREFA+$\delta$.

As described above, in the conventional internal voltage generating circuit, when a level of an external voltage VEXT is heightened, an overshooting occurs, thereby increasing the internal voltage VCCA to a level higher than a target voltage during an overdriving operation, so that the internal voltage VCCA does not thereafter decrease to a reference voltage level. As a result, a sensing time is increased during a bit line sensing operation, leading to a delay in data write and read speed.

SUMMARY OF THE INVENTION

A circuit, in accordance with an embodiment of the present invention, comprises a comparing means for comparing an internal voltage to a reference voltage for outputting a first driving signal, an internal voltage driving means for outputting the internal voltage in response to the first driving signal, an internal voltage detecting means for detecting the internal voltage and for generating a second driving signal in response to an active signal, and an overdriving control means for controlling the first driving signal in response to the second driving signal.

The internal voltage driving means may include a PMOS transistor. The overdriving control means may include an NMOS transistor having a drain connected to an output terminal of the comparing means, a gate for receiving the second driving signal, and a source connected to a ground voltage. The active signal may be a pulse signal having a predetermined pulse width.

The internal voltage detecting means may inactivate the second driving signal when the active signal is inactivated, activate the second driving signal when the active signal is activated and the internal voltage is less than or equal to a target voltage, and inactivate the second driving signal when the active signal is activated and the internal voltage is greater than the target voltage.

The internal voltage detecting means may output the second driving signal at a low level when the active signal is at the low level, output the second driving signal at a high level when the active signal is at the high level and the internal voltage is less than or equal to a target voltage, and output the second driving signal at the low level when the active signal is at the high level and the internal voltage is greater than the target voltage.

The internal voltage detecting means may include a first inverter for inverting the active signal to generate an inverted active signal, wherein the first inverter is connected between the internal voltage and a ground voltage, a second inverter for inverting the inverted active signal, wherein the second inverter is connected between the internal voltage and the ground voltage, a first voltage generating circuit for receiving an output signal of the second inverter and for outputting a first voltage derived from the output signal, a first transistor connected to the internal voltage, wherein the first transistor is turned on to activate the second driving signal in response to the inverted active signal, a second transistor connected to a ground voltage, wherein the second transistor is turned on to inactivate the second driving signal when the first voltage is greater than a predetermined voltage, and a switching transistor, wherein the switching transistor is turned onto inactivate the second driving signal in response to the inverted active signal. The first transistor may include a source for receiving the internal voltage, a gate for receiving the inverted active signal, and a drain for outputting the second driving signal. The second transistor may include a source for receiving the ground voltage, a gate for receiving the first voltage, and a drain for outputting the second driving signal. The switching transistor may include a gate for receiving the inverted active signal, a source connected to the ground voltage, and a drain for outputting the second driving signal.

Another circuit, in accordance with an embodiment of the present invention, comprises a first comparing means for comparing an internal voltage to a reference voltage for outputting a first driving signal, an internal voltage driving means for outputting the internal voltage in response to the first driving signal, a voltage dividing means for dividing the internal voltage to generate a divided voltage in response to an active signal, a second comparing means for comparing the divided voltage to the reference voltage for generating a second driving signal, and an overdriving control means for controlling the first driving signal in response to the second driving signal.

The overdriving control means may include an NMOS transistor having a drain connected to an output terminal of the first comparing means, a gate for receiving the second driving signal, and a source connected to a ground voltage.

The voltage dividing means may output the internal voltage when the active signal is inactivated, and divide the internal voltage when the active signal is activated to generate the divided voltage when the active signal is activated. The divided voltage may be less than the reference voltage when the internal voltage is less than or equal to a target voltage and may be greater than the reference voltage when the internal voltage is greater than the target voltage. The voltage dividing means may output the internal voltage when the active signal is at a low level, and divide the internal voltage when the active signal is at a high level to generate the divided voltage when the active signal is activated.

The voltage dividing means may include a first load connected to the internal voltage and a first node, a second load connected between the first node and a second node, and a switching transistor having a drain connected to the second node, a gate for receiving the active signal, and a source connected to a ground voltage, wherein the divided voltage is generated through the first node. The switching transistor may include an NMOS transistor.

The second comparing means may inactivate the second driving signal when the active signal is inactivated, and compare the divided voltage to the reference voltage when the active signal is activated for activating the second driving signal when the divided voltage is less than the reference voltage and for inactivating the second driving signal when the divided voltage is greater than the reference voltage.

The second comparing means may output the second driving signal at a low level when the active signal is at the low level, and compare the divided voltage to the reference voltage when the active signal is at a high level for outputting the second driving signal at the high level when the divided voltage is less than the reference voltage and for outputting the second driving signal at the low level when the divided voltage is greater than the reference voltage.

The second comparing mean may include a first inverter for inverting the active signal to generate an inverted active signal, a switching transistor for inactivating the second driving signal in response to the inverted active signal, and a comparator for comparing the divided voltage to the reference voltage for activating the second driving signal when the divided voltage is less than the reference voltage and for inactivating the second driving signal when the divided voltage is greater than the reference voltage. The switching transistor may include a gate for receiving the inverted active signal, a source connected to a ground voltage, and a drain for outputting the second driving signal.

Another circuit, in accordance with an embodiment of the present invention comprises a comparing means for comparing a comparison voltage to a reference voltage to generate a first driving signal, an internal voltage driving means for outputting an internal voltage in response to the first driving signal, and a voltage dividing means for receiving the internal voltage, for generating, in response to an active signal, the comparison voltage having a value equal to the internal voltage during a normal driving operation, and for dividing, in response to the active signal, the internal voltage to generate the comparison voltage having a value equal to the divided internal voltage during an overdriving operation.

The voltage dividing means may output the comparison voltage equal to the internal voltage when the active signal is inactivated, and divide the internal voltage to generate the comparison voltage equal to the divided internal voltage when the active signal is activated. The divided internal voltage may be less than the reference voltage when the internal voltage is less than or equal to a target voltage and may be greater than the reference voltage when the internal voltage is greater than the target voltage.

The voltage dividing means may output the comparison voltage equal to the internal voltage when the active signal is at a low level, and divide the internal voltage to generate the comparison voltage equal to the divided internal voltage when the active signal is at a high level.

The voltage dividing means may include a first load connected to the internal voltage and a first node, a second load connected between the first node and a second node, and a switching transistor having a drain connected to the second node, a gate for receiving the active signal, and a source connected to a ground voltage, wherein the divided internal voltage is generated through the first node. The switching transistor may include an NMOS transistor.

A voltage generating method, in accordance with an embodiment of the present invention, comprises comparing an internal voltage to a reference voltage to generate a first driving signal, outputting the internal voltage in response to the first driving signal, detecting the internal voltage and outputting a second driving signal in response to an active signal, and controlling the first driving signal in response to the second driving signal.

The method may further comprise inactiviating the second driving signal when the active signal is inactivated, activating the second driving signal when the active signal is activated and the internal voltage is less than or equal to a target voltage, and inactivating the second driving signal when the active signal is activated and the internal voltage is greater than the target voltage.

The method may also comprise outputting the second driving signal at a low level when the active signal is at the low level, outputting the second driving signal at a high level when the active signal is at the high level and the internal voltage is less than or equal to a target voltage, and outputting the second driving signal at a low level when the active signal is at the high level and the internal voltage is greater than the target voltage.

BRIEF DESCRIPTION OF THE DRAWINGS

Preferred embodiments of the invention can be understood in more detail from the following descriptions taken in conjunction with the accompanying drawings in which.

DETAILED DESCRIPTION OF PROFFERED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 3:
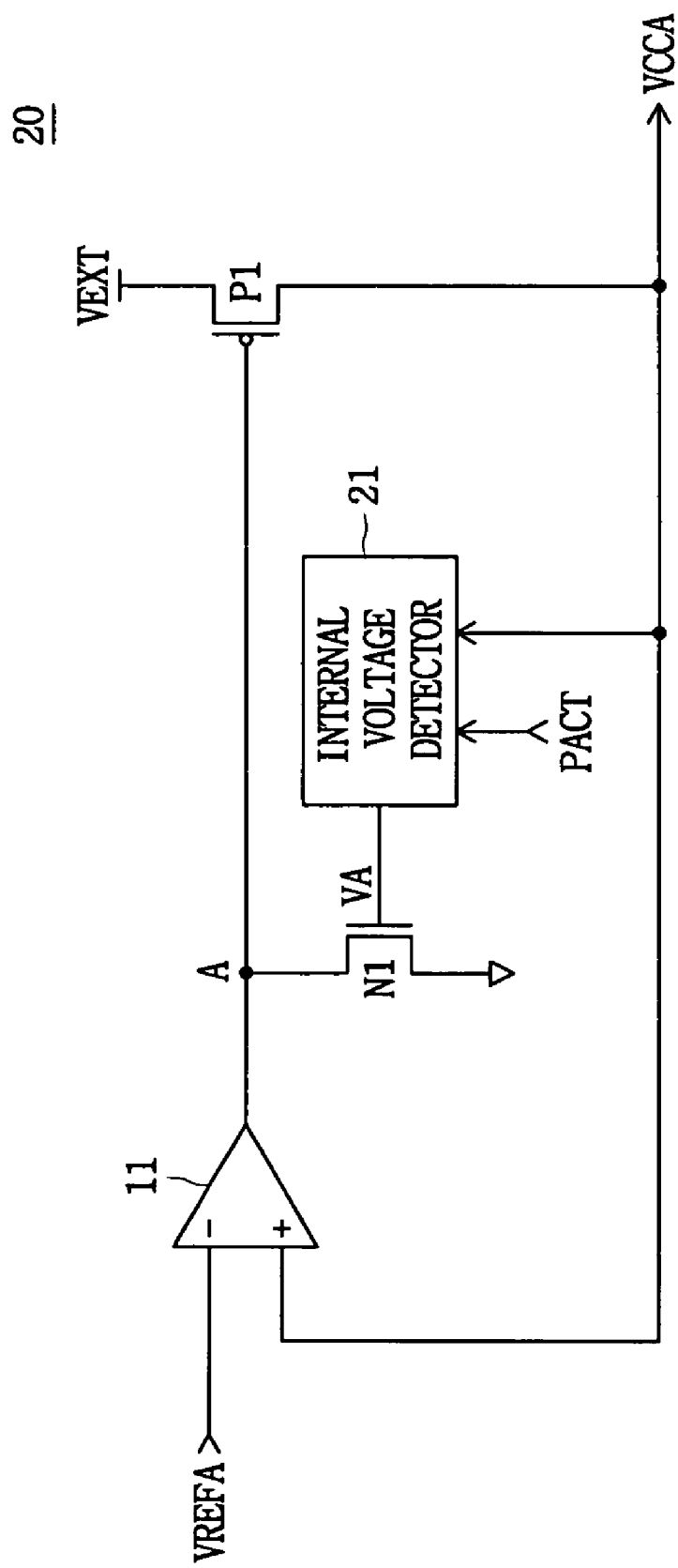
FIG. 3 is a circuit diagram illustrating an internal voltage generating circuit according to an embodiment of the present invention.

FIG. 3 is a circuit diagram illustrating an internal voltage generating circuit according to an embodiment of the present invention. The internal voltage generating circuit 20 includes a comparator 11, an NMOS transistor N1, a PMOS transistor P1, and an internal voltage detector 21.

Figure 1:
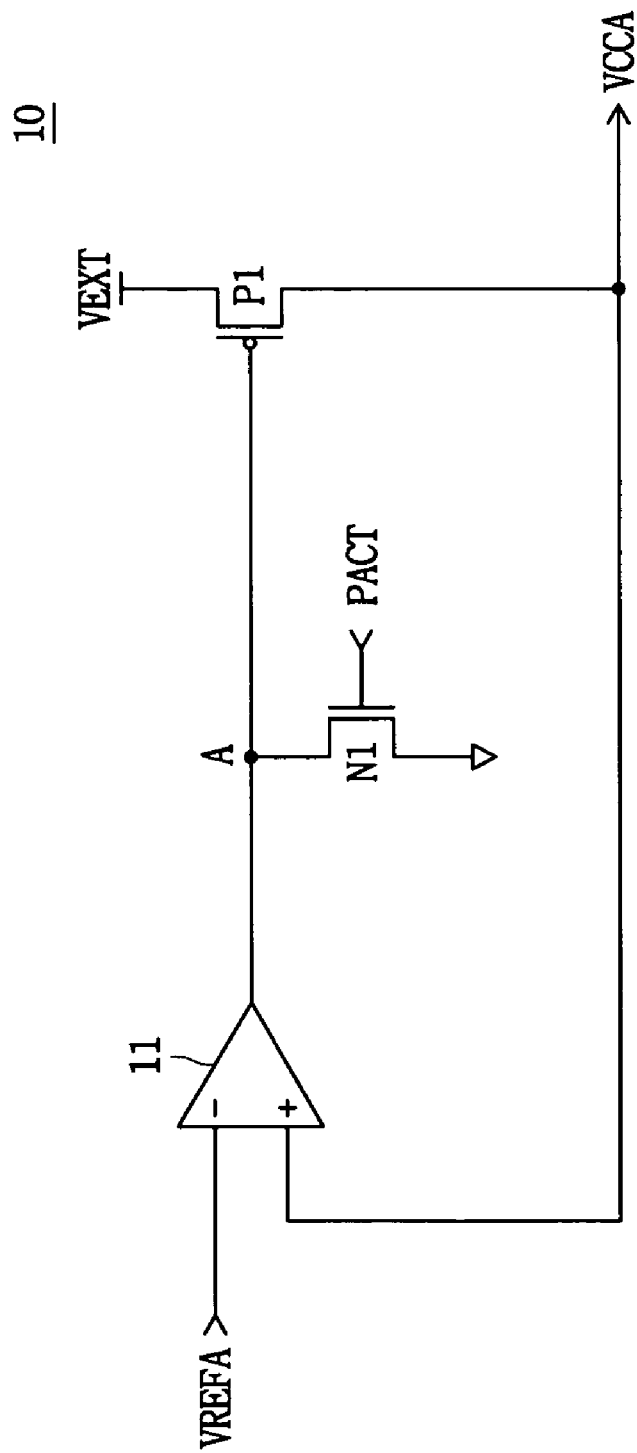
FIG. 1 is a circuit diagram illustrating a conventional internal voltage generating circuit.
Figure 2:
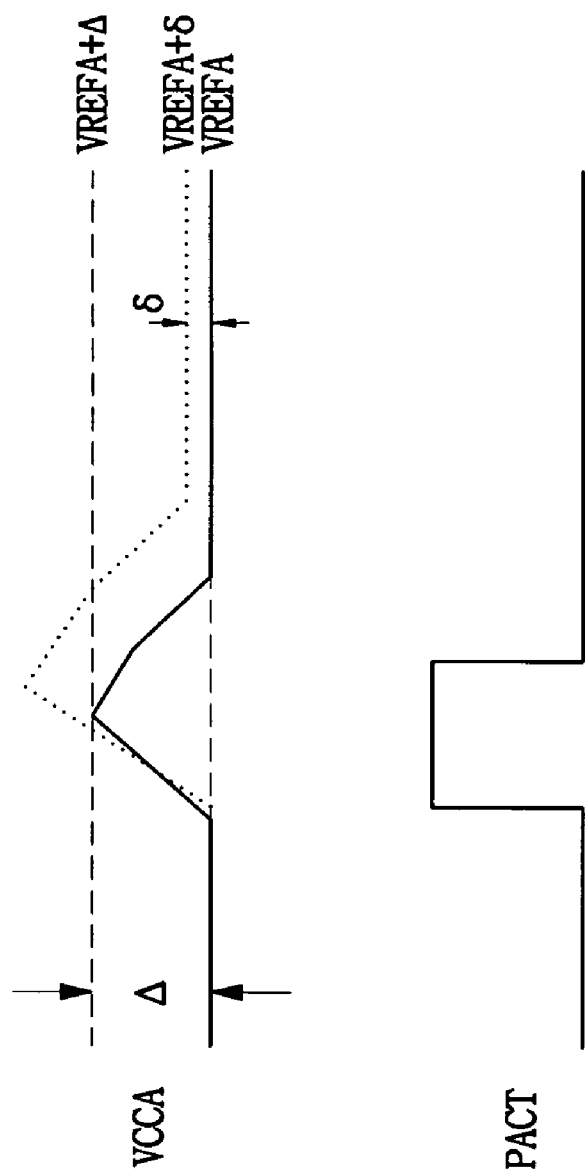
FIG. 2 is a graph illustrating a variation of an internal voltage VCCA with respect to an active signal PACT in the conventional internal voltage generating circuit.

Like references in FIGS. 1 and 3 denote like components which perform the same or similar functions. For example, the comparator 11 compares the internal voltage VCCA to the reference voltage VREFA and outputs a driving signal to the PMOS transistor P1. For purposes of this disclosure, an inactivated signal may be a signal that is generated below a predetermined voltage level (e.g., a "low" level signal). Similarly, an activated signal may be a signal that is generated above a predetermined voltage level (e.g., a "high" level signal). Examples of low and high levels are explained further below with reference to FIG. 9.

Referring to FIG. 3, the internal voltage detector 21 detects an internal voltage VCCA in response to an active signal PACT, and activates a signal VA when a level of an internal voltage VCCA is less than or equal to a target voltage and inactivates a signal VA when an internal voltage VCCA exceeds a target voltage. More specifically, when an active signal PACT is activated, the internal voltage detector 21 first detects a level of an internal voltage VCCA and then generates a signal VA having a high level when the internal voltage VCCA is less than or equal to a target voltage, and generates a signal VA having a low level when the internal voltage VCCA exceeds a target voltage. Also, when an active signal PACT is inactivated (e.g., produced at a low level), the internal voltage detector 21 generates a signal VA having a low level.

In operation, when an active signal PACT having a low level is generated, the internal voltage detector 21 of the internal voltage generating circuit 20 generates a signal VA having a low level, and the NMOS transistor N1 is turned off. In this state, the internal voltage generating circuit 20 performs a normal driving operation for maintaining a level of an internal voltage VCCA at the level of the reference voltage VREF, wherein the normal driving operation is based on an output signal sent to the PMOS transistor P1 from the comparator 11.

When an active signal PACT having a high level is generated, the internal voltage detector 21 detects a level of an internal voltage VCCA and generates a signal VA having a high level when an internal voltage VCCA is less than or equal to a target voltage, so that the NMOS transistor N1 is turned on. As a result, a voltage level of a node A becomes lower than during a normal driving operation, and a driving ability of the PMOS transistor P1 is improved when compared with a normal driving operation, so that the PMOS transistor P1 performs an overdriving operation. However, when a level of an internal voltage VCCA is beyond a target voltage, the internal voltage detector 21 generates a signal VA having a low level, and thus the NMOS transistor N1 is turned off. As a result, a driving ability of the PMOS transistor P1 becomes less than during a normal driving operation, whereby an overdriving operation is stopped. Accordingly, depending on the level of the signal VA received by the NMOS transistor N1, the corresponding state of the NMOS transistor N1 (i.e., on or off) controls whether overdriving occurs.

That is, the internal voltage detector 21 of FIG. 3 monitors a level of an internal voltage VCCA in the state that an active signal PACT is produced, and turns on the NMOS transistor N1 to perform an overdriving operation when the internal voltage VCCA is less than or equal to the target voltage or turns off the NMOS transistor N1 to stop an overdriving operation when the internal voltage VCCA is greater than the target voltage.

Figure 4:
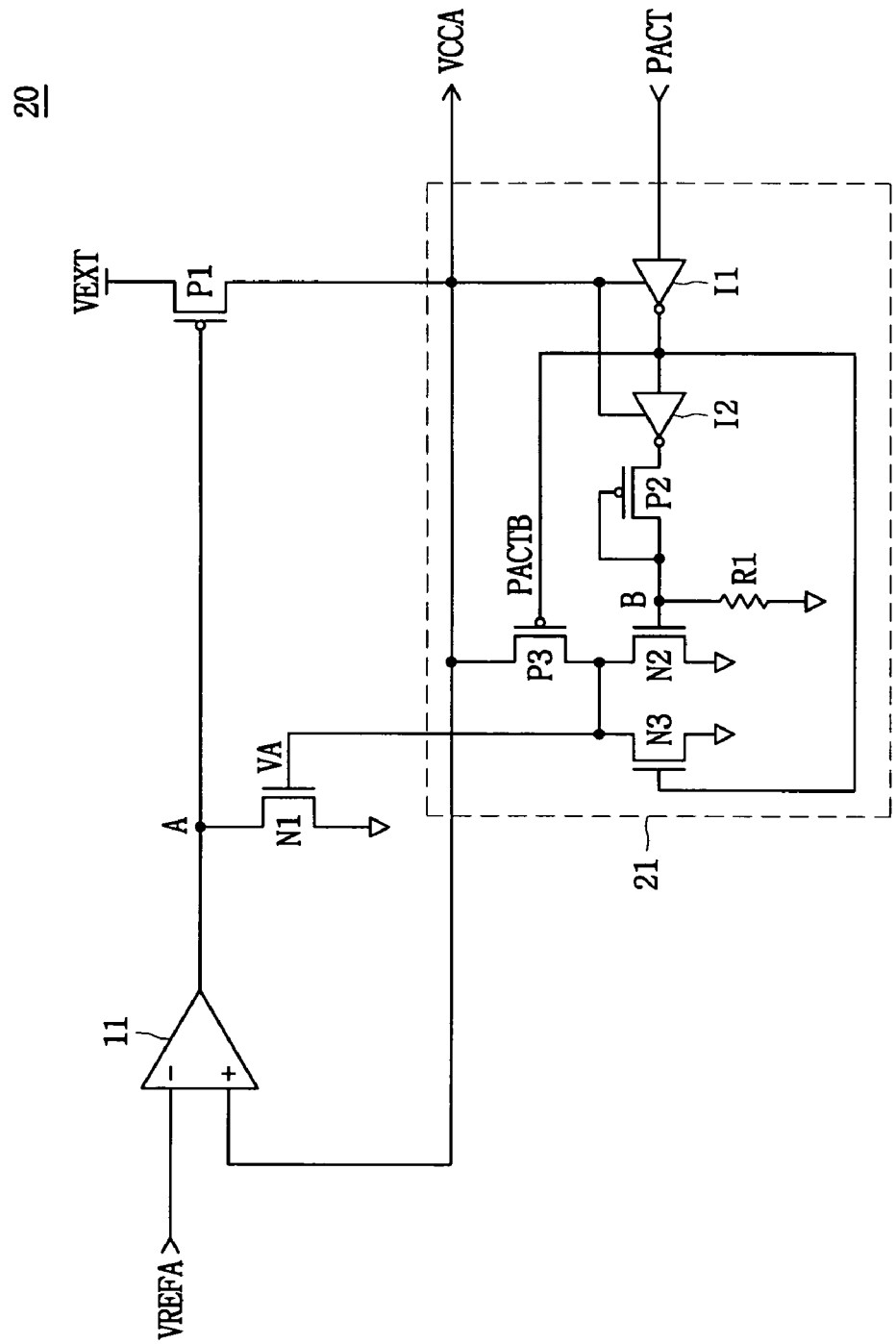
FIG. 4 is a circuit diagram illustrating an internal voltage detector of the internal voltage generating circuit of FIG. 3.

FIG. 4 is a circuit diagram illustrating the internal voltage detector 21 of the internal voltage generating circuit 20 of FIG. 3. The internal voltage detector 21 includes inverters I1 and I2, PMOS transistors P2 and P3, NMOS transistors N2 and N3, and a resistor R1.

The internal voltage detector 21 is configured such that an internal voltage VCCA is applied as power voltages for the inverters I1 and I2.

Functions of components of the internal voltage detector 21 of FIG. 4 are described below.

The inverter I1 inverts an active signal PACT to generate an inverted active signal PACTB. The inverter I2 inverts the inverted active signal PACTB. The PMOS transistor P2 lowers a voltage level of an output signal of the inverter I2 by a level equal to a threshold voltage VTP of the PMOS transistor P2. The PMOS transistor P2 and the resistor R1 divide a voltage of an output signal of the inverter I2 to generate a divided voltage at a node B. The NMOS transistor N2 is turned on when a voltage level of the node B is greater than a threshold voltage VTN of the NMOS transistor N2 or turned off when a voltage level of the node B is less than a threshold voltage VTN of the NMOS transistor N2. The PMOS transistor P3 is turned on in response to a low level inverted active signal PACTB to increase a voltage at the node B. The NMOS transistor N3 is turned on in response to a high level inverted active signal PACTB to prevent a signal VA from being floated during a normal driving operation.

In operation, when an active signal PACT having a low level is applied to the inverter I1, the inverter I1 of the internal voltage detector 21 generates a signal having a high level. The PMOS transistor P3 is turned off and the NMOS transistor N3 is turned on, so that a signal VA having a low level is generated. Accordingly, the NMOS transistor N1 is turned off, and the PMOS transistor P1 performs a normal driving operation in response to an output signal of the comparator 11.

When an active signal PACT having a high level is applied to the inverter I1, the inverter I1 generates a signal having a low level. The PMOS transistor P3 is turned on to generate a signal VA having a high level. The NMOS transistor N1 is turned on in response to the high level signal VA to lower a voltage level of a node A. Thus, the PMOS transistor P1 performs an overdriving operation.

The inverter I2 generates a signal having a high level, whereby an output voltage of the inverter I2 is equal to the internal voltage VCCA. The PMOS transistor P2 and the resistor R1 divide the output voltage of the inverter I2 to generate a divided voltage at node B. The NMOS transistor N2 is turned off to maintain a high level signal VA when a voltage level of a node B is lower than a threshold voltage VTN of the NMOS transistor N2 (that is, when an internal voltage VCCA level is less than or equal to a target voltage). A voltage decrease at node A caused by the NMOS transistor N1 continue to increase the driving ability of the PMOS transistor P1. That is, the PMOS transistor P1 continues to perform an overdriving operation.

Alternatively, the NMOS transistor N2 is turned on to lower a voltage level of a signal VA when a voltage at node B is higher than a threshold voltage of the NMOS transistor N2 (that is, when a level of the internal voltage VCCA is greater than a target voltage). Thus, a voltage decrease at node A caused by the NMOS transistor N1 is gradually reduced, so that a driving ability of the PMOS transistor P1 is lowered to a driving ability for a normal driving operation. Therefore, the PMOS transistor P1 stops the overdriving operation.

As a result, an overdriving operation can be controlled even though an active signal PACT having a high level is generated. The internal voltage detector 21 turns on the PMOS transistor P1 to make the PMOS transistor P1 perform an overdriving operation when an internal voltage VCCA level is less than or equal to a target voltage. The internal voltage detector 21 turns off the NMOS transistor N2 to cause the PMOS transistor P1 not to perform an overdriving operation when an internal voltage VCCA level exceeds a target voltage, thereby preventing an overshooting of the internal voltage VCCA level.

Figure 5:
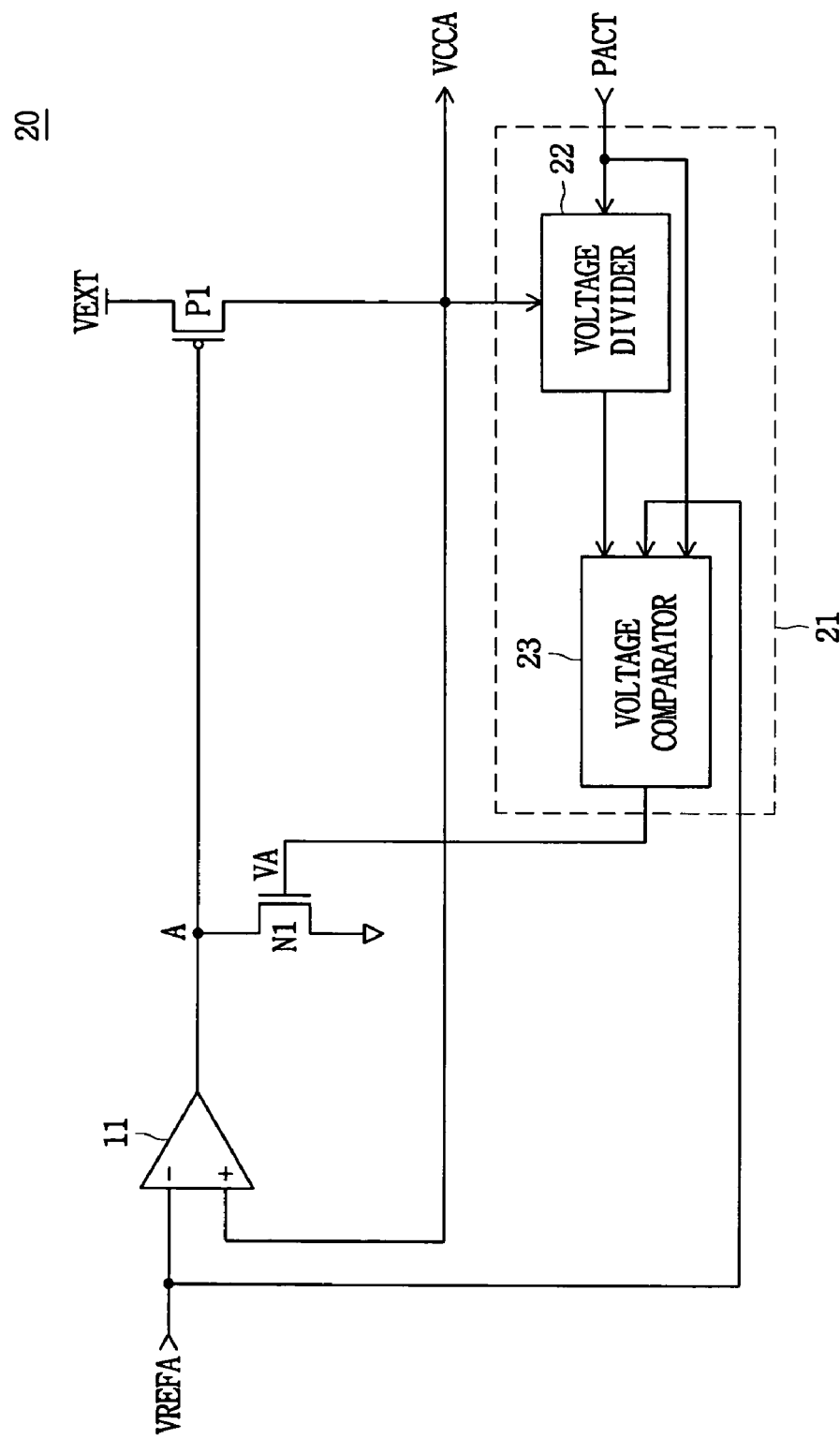
FIG. 5 is a circuit diagram illustrating a modification of an internal voltage detector of the internal voltage generating circuit of FIG. 3.

FIG. 5 is a circuit diagram illustrating a modification of an internal voltage detector 21 of the internal voltage generating circuit 20 of FIG. 3. The internal voltage detector 21 includes a voltage divider 22 and a voltage comparator 23.

Functions of components of the internal voltage detector of FIG. 5 are explained below.

The voltage divider 22 divides an internal voltage VCCA in response to an active signal PACT. The voltage comparator 23 compares a divided voltage from the voltage divider 22 to a reference voltage VREFA to generate a signal VA.

In operation, when an active signal PACT having a low level is generated, the voltage divider 22 does not perform a voltage dividing operation. The voltage comparator 23 generates a signal VA having a low level in response to an active signal PACT having a low level. As a result, the NMOS transistor N1 is turned off, so that the PMOS transistor P1 performs a normal driving operation.

When an active signal PACT having a high level is generated, the voltage divider 22 divides an internal voltage VCCA to generate a divided voltage. When the internal voltage VCCA is less than or equal to a target voltage, the divided voltage is lower than a reference voltage VREFA, whereas when an internal voltage VCCA exceeds a target voltage, the divided voltage is higher than a reference voltage VREFA. The voltage comparator 23 compares the divided voltage to a reference voltage VREFA to generate a signal VA having a high level when the divided voltage is lower than a reference voltage VREFA or to generate a signal VA having a low level when the divided voltage is higher than a reference voltage VREFA.

Therefore, when an internal voltage VCCA is less than or equal to a target voltage, the internal voltage detector 21 generates a signal VA having a high level to turn on the NMOS transistor N1 so that the PMOS transistor P1 performs an overdriving operation, whereas when an internal voltage VCCA exceeds a target voltage, the internal voltage detector 21 generates a signal VA having a low level to turn off the NMOS transistor N1 so that the PMOS transistor P1 stops the overdriving operation.

Figure 6:
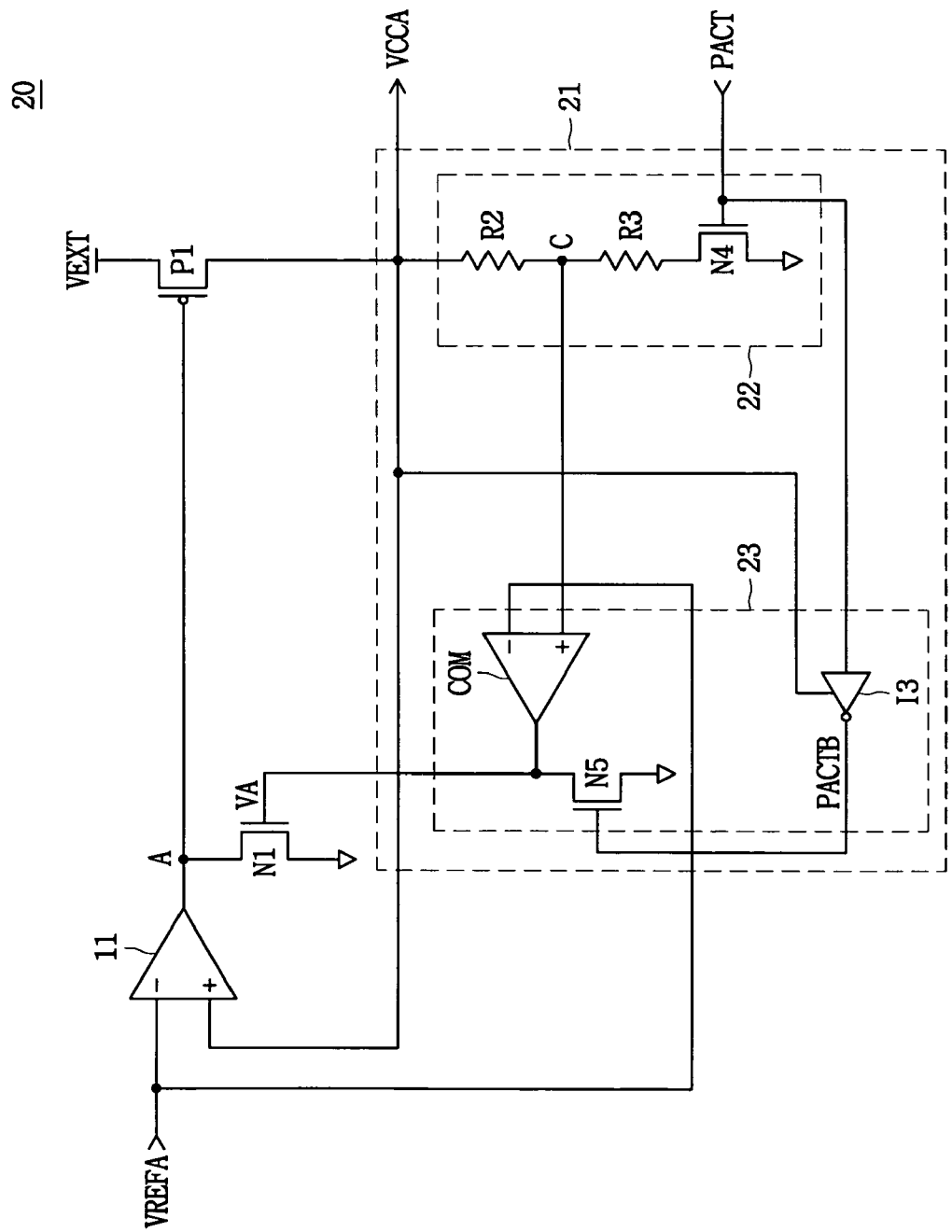
FIG. 6 is a circuit illustrating the internal voltage detector of FIG. 5.

FIG. 6 is a detailed view illustrating the internal voltage detector 21 of FIG. 5. The voltage divider 22 includes resistors R2 and R3 and an NMOS transistor N4, and the voltage comparator 23 includes a comparator COM, an inverter I3, and an NMOS transistor N5. A MOS transistor can be used in place of the resistors R2 and R3.

In FIG. 6, an internal voltage VCCA is applied as a power voltage for the inverter 13.

Functions of components of the internal voltage detector of FIG. 6 are explained below.

The NMOS transistor N4 is turned on in response to an active signal PACT having a high level. When the NMOS transistor is turned on, the resistors R2 and R3 divide an internal voltage VCCA and generate a divided voltage at a node C. The comparator COM compares a reference voltage VREFA to the divided voltage to generate a signal VA. The inverter I3 inverts an active signal PACT to generate an inverted active signal PACTB. The NMOS transistor N5 is turned on in response to the high level inverted active signal PACTB to generate a signal VA having a low level. The NMOS transistor N5 prevents the signal VA from being floated during a normal driving operation.

In operation, when an active signal PACT having a low level is applied to the inverter I3 of the internal voltage detector 21, the inverter I3 generates an inverted active signal PACTB having a high level. Hence, the NMOS transistor N5 is turned on to generate a signal VA having a low level. As a result, the NMOS transistor N1 is turned off, whereby the PMOS transistor P1 performs a normal driving operation.

When an active signal PACT having a high level is applied to the inverter I3, the NMOS transistor N4 is turned on and the voltage divider 22 generates a voltage divided by the resistors R2 and R3 at a node C. The voltage divider 22 generates at node C a divided voltage which is lower than a reference voltage VREFA when a level of an internal voltage VCCA is less than or equal to a target voltage or generates at node C a divided voltage which is higher than a reference voltage VREFA when an internal voltage VCCA is greater than a target voltage. The inverter I3 generates an inverted active signal PACTB having a low level, and thus the NMOS transistor N5 is turned off. The comparator COM compares a voltage of node C to a reference voltage VREFA to generate a signal VA having a high level when a voltage of node C is lower than a reference voltage VREFA or to generate a signal VA having a low level when a voltage of node C is higher than a reference voltage VREFA. When the signal VA having a high level is generated the NMOS transistor N1 is turned on so that the PMOS transistor P1 performs an overdriving operation, whereas when the signal VA having a low level is generated the NMOS transistor N1 is turned off so that the PMOS transistor P1 stops the overdriving operation.

Figure 7:
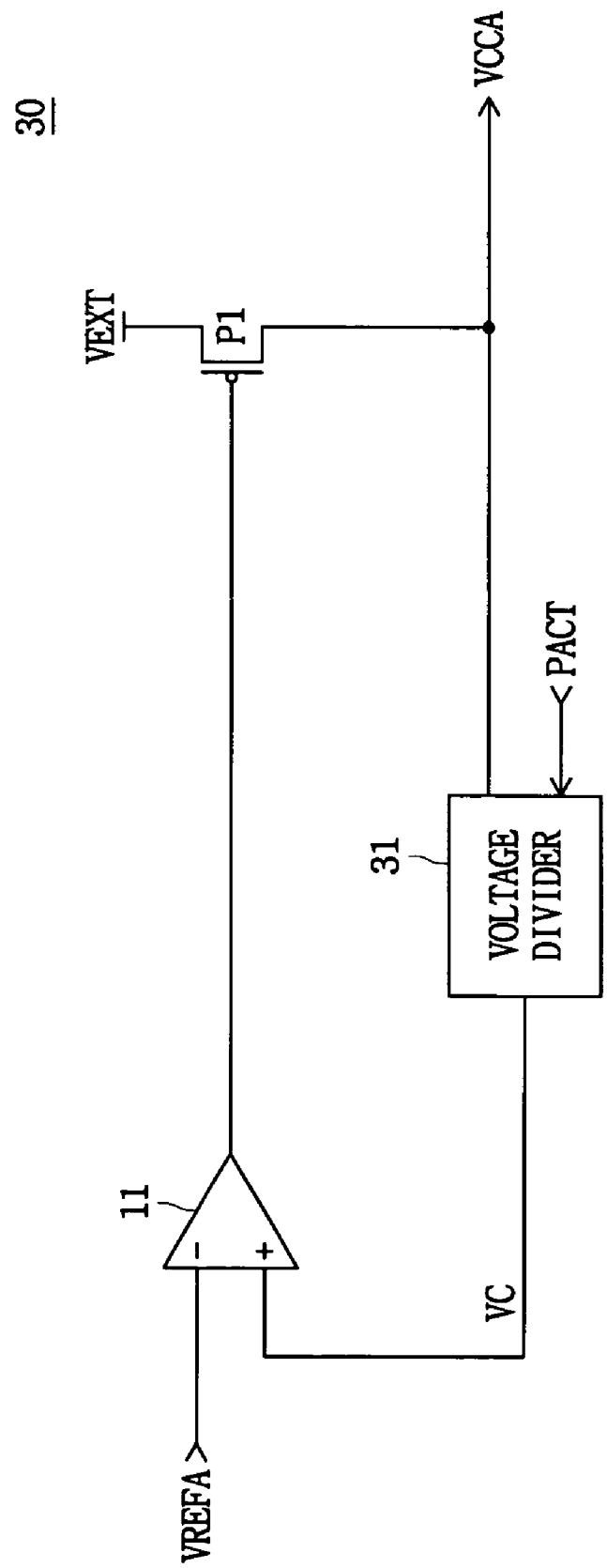
FIG. 7 is a circuit diagram illustrating an internal voltage generating circuit according to an embodiment of the present invention.

FIG. 7 is a circuit diagram illustrating an internal voltage generating circuit 30 according to an embodiment of the present invention. The internal voltage generating circuit 30 includes a comparator 11, a PMOS transistor P1, and a voltage divider 31.

In operation, when an active signal PACT having a low level is applied to the voltage divider 31 of the internal voltage generating circuit 30, the voltage divider 31 generates an internal voltage VCCA as a voltage VC. The comparator 11 repeatedly performs an operation that lowers a level of an output voltage when a voltage VC is lower than a reference voltage VREFA or heightens a level of an output voltage when a voltage VC is higher than a reference voltage VREFA. The PMOS transistor P1 performs a normal driving operation, based on an output voltage of the comparator 11, to maintain the internal voltage VCCA at a level equal to the reference voltage VREFA.

When an active signal PACT having a high level is applied to the voltage divider 31, the voltage divider 31 generates a voltage VC by dividing an internal voltage VCCA. The voltage divider 31 divides an internal voltage VCCA to generate a voltage VC which is lower than a voltage for a normal driving operation when an internal voltage VCCA is less than or equal to a target voltage and divides an internal voltage VCCA to generate a voltage VC which is higher than a voltage for a normal driving operation when an internal voltage VCCA is greater than a target voltage. To cause the PMOS transistor P1 to perform an overdriving operation, the comparator 11 generates an output voltage which is lower than a voltage for a normal driving operation when a voltage VC, which is lower than a voltage for a normal driving operation, is inputted. The comparator 11 increases the output voltage to cause the PMOS transistor P1 to stop an overdriving operation when a voltage VC, which is higher than a reference voltage VREFA, is inputted.

Figure 8:
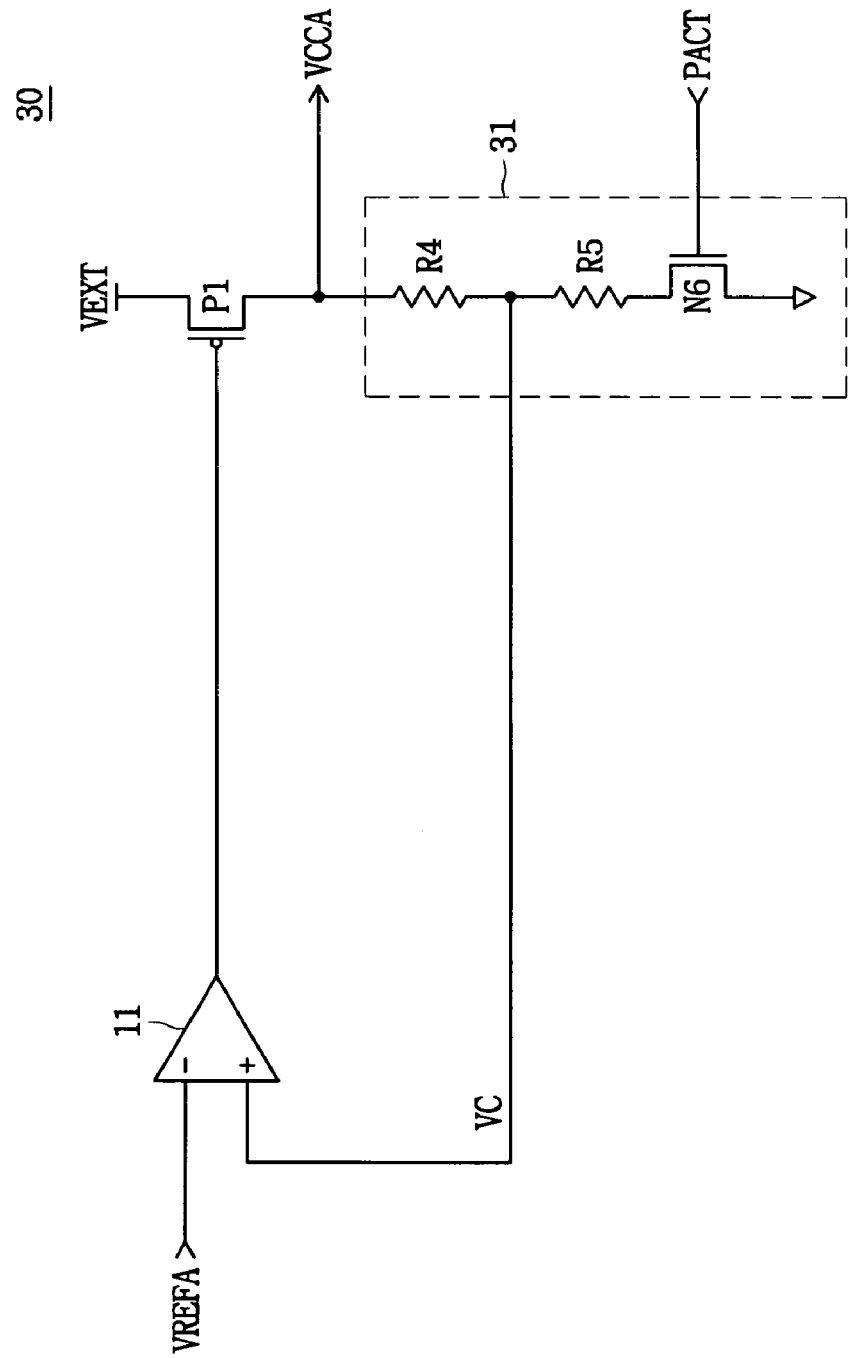
FIG. 8 is a circuit diagram illustrating a voltage divider of the internal voltage generating circuit of FIG. 7.

FIG. 8 is a circuit diagram illustrating a voltage divider 31 of the internal voltage generating circuit 30 of FIG. 7. The voltage divider 31 includes resistors R4 and R5 and NMOS transistor N6.

In operation, when an active signal PACT having a low level is applied to the voltage divider 31, the NMOS transistor N6 is turned off, and the voltage divider 31 outputs an internal voltage VCCA as a voltage VC.

When an active signal PACT having a high level is applied to the voltage divider 31, the NMOS transistor N6 is turned on, and the voltage divider 31 generates a voltage VC divided by the resistors R4 and R5. Here, the voltage divider 31 generates a voltage VC which is lower than a voltage for a normal driving operation, when an internal voltage VCCA is less than or equal to a target voltage, and generates a voltage VC which is higher than a reference voltage VREFA, when an internal voltage VCCA is greater than a target voltage. The generation of varying voltages VC is performed by appropriately adjusting resistance values of the resistors R4 and R5 of the voltage divider 31.

Therefore, when an active signal PACT is produced, the internal voltage generating circuit 30 of FIG. 8 performs an overdriving operation when an internal voltage VCCA is less than or equal to a target voltage and stops an overdriving operation when an internal voltage VCCA is greater than a target voltage.

Figure 9:
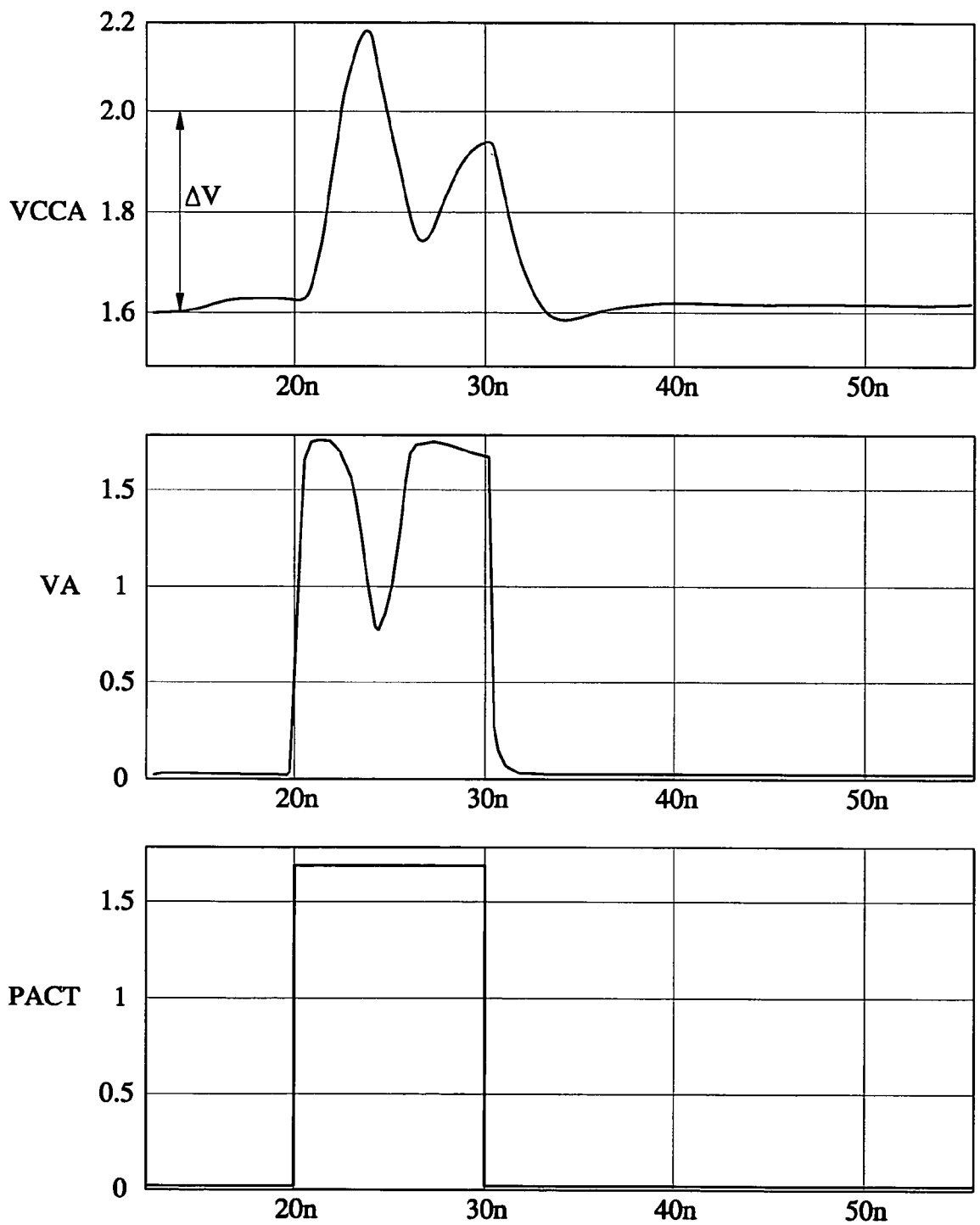
FIG. 9 is a simulation graph illustrating a variation of an internal voltage VCCA and a signal VC in the internal voltage generating circuit of FIG. 3.

FIG. 9 is a simulation graph illustrating a variation of an internal voltage VCCA and a signal VA in the internal voltage generating circuit 20 of FIG. 3.

FIG. 9 shows a variation of an internal voltage VCCA and a signal VA when a reference voltage is about 1.6 volts, a target voltage is about 2.0 volts (=1.6 volts+Δ(0.4 volts)), a relatively high external power voltage VEXT of about 4 volts is applied, and an active signal PACT having a high level is generated.

When an active signal PACT having a high level is applied, for example at time 20n, a level of a signal VA is changed to a high level. The NMOS transistor N1 is turned on, and the PMOS transistor P1 performs an overdriving operation. As a result, the internal voltage VCCA is increased.

When the internal voltage VCCA exceeds a target voltage, a signal VA is changed to a low level. The NMOS transistor N1 is turned off, and the PMOS transistor P1 stops an overdriving operation. Thus, the internal voltage VCCA is lowered.

When the internal voltage VCCA drops to less than the target voltage, a signal VA is changed to a high level. Thus, the NMOS transistor N1 is turned on again, and the PMOS transistor P1 again performs an overdriving operation.

As can be seen by a graph of FIG. 9, the internal voltage generating circuit of an embodiment of the present invention does not continually perform an overdriving operation when an active signal is produced. Instead, it is possible to perform an over driving operation when a level of an internal voltage is less than or equal to a target voltage and to stop an overdriving operation when a level of an internal voltage is more than a target voltage.

As described hereinabove, the internal voltage generating circuit according to an embodiment of the present invention monitors a variation of an internal voltage when an active signal is activated or produced and stops an overdriving operation when an internal voltage exceeds a target voltage and performs an overdriving operation when an internal voltage is less than or equal to a target voltage, thereby compensating for overshooting of an internal voltage even though an external voltage is increased.

Therefore, semiconductor memory devices employing the internal voltage generating circuit according to an embodiment of the present invention have improved bit line sensing speeds, and thereby minimize data read and write delays.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A circuit, comprising:
a comparing means for comparing an internal voltage to a reference voltage for outputting a first driving signal;
an internal voltage driving means for outputting the internal voltage in response to the first driving signal;
an internal voltage detecting means for detecting the internal voltage and for generating a second driving signal in response to an active signal; and
an overdriving control means for controlling the first driving signal in response to the second driving signal, wherein the internal voltage detecting means includes:
a first inverter for inverting the active signal to generate an inverted active signal, wherein the first inverter is connected between the internal voltage and a ground voltage;
a second inverter for inverting the inverted active signal, wherein the second inverter is connected between the internal voltage and the ground voltage;
a first voltage generating circuit for receiving an output signal of the second inverter and for outputting a first voltage derived from the output signal;
a first transistor connected to the internal voltage, wherein the first transistor is turned on to activate the second driving signal in response to the inverted active signal;
a second transistor connected to a ground voltage, wherein the second transistor is turned on to inactivate the second driving signal when the first voltage is greater than a predetermined voltage; and
a switching transistor, wherein the switching transistor is turned onto inactivate the second driving signal in response to the inverted active signal.

2. The circuit of claim 1, wherein the internal voltage driving means includes a PMOS transistor.

3. The circuit of claim 1, wherein the overdriving control means includes an NMOS transistor having a drain connected to an output terminal of the comparing means, a gate for receiving the second driving signal, and a source connected to a ground voltage.

4. The circuit of claim 1, wherein the active signal is a pulse signal having a predetermined pulse width.

5. The circuit of claim 1, wherein the internal voltage detecting means inactivates the second driving signal when the active signal is inactivated, and inactivates the second driving signal when the active signal is activated and the internal voltage is greater than the target voltage.

6. The circuit of claim 1, wherein the first transistor includes a source for receiving the internal voltage, a gate for receiving the inverted active signal, and a drain for outputting the second driving signal.

7. The circuit of claim 1, wherein the second transistor includes a source for receiving the ground voltage, a gate for receiving the first voltage, and a drain for outputting the second driving signal.

8. The circuit of claim 1, wherein the switching transistor includes a gate for receiving the inverted active signal, a source connected to the ground voltage, and a drain for outputting the second driving signal.

9. A circuit, comprising:
a first comparing means for comparing an internal voltage to a reference voltage for outputting a first driving signal;
an internal voltage driving means for outputting the internal voltage in response to the first driving signal;
a voltage dividing means for dividing the internal voltage to generate a divided voltage in response to an active signal;
a second comparing means for comparing the divided voltage to the reference voltage for generating a second driving signal; and
an overdriving control means for controlling the first driving signal in response to the second driving signal, wherein the second comparing means includes:
a first inverter for inverting the active signal to generate an inverted active signal;
a switching transistor for inactivating the second driving signal in response to the inverted active signal; and
a comparator for comparing the divided voltage to the reference voltage for activating the second driving signal when the divided voltage is less than the reference voltage and for inactivating the second driving signal when the divided voltage is greater than the reference voltage.

10. The circuit of claim 9, wherein the internal voltage driving means includes a PMOS transistor.

11. The circuit of claim 9, wherein the overdriving control means includes an NMOS transistor having a drain connected to an output terminal of the first comparing means, a gate for receiving the second driving signal, and a source connected to a ground voltage.

12. The circuit of claim 9, wherein the active signal is a pulse signal having a predetermined pulse width.

13. The circuit of claim 9, wherein the voltage dividing means outputs the internal voltage when the active signal is at a low level, and divides the internal voltage to generate the divided voltage when the active signal is at a high level.

14. The circuit of claim 9, wherein the voltage dividing means includes:
   a first load connected to the internal voltage and a first node;
   a second load connected between the first node and a second node; and
   a switching transistor having a drain connected to the second node, a gate for receiving the active signal, and a source connected to a ground voltage,
   wherein the divided voltage is generated through the first node.

15. The circuit of claim 14, wherein the switching transistor includes an NMOS transistor.

16. The circuit of claim 9, wherein the second comparing means inactivates the second driving signal when the active signal is inactivated, and compares the divided voltage to the reference voltage when the active signal is activated for activating the second driving signal when the divided voltage is less than the reference voltage and for inactivating the second driving signal when the divided voltage is greater than the reference voltage.

17. The circuit of claim 9, wherein the second comparing means outputs the second driving signal at a low level when the active signal is at the low level, and compares the divided voltage to the reference voltage when the active signal is at a high level for outputting the second driving signal at the high level when the divided voltage is less than the reference voltage and for outputting the second driving signal at the low level when the divided voltage is greater than the reference voltage.

18. The circuit of claim 9, wherein the switching transistor includes a gate for receiving the inverted active signal, a source connected to a ground voltage, and a drain for outputting the second driving signal.

19. A voltage generating method, comprising:
   comparing an internal voltage to a reference voltage to generate a first driving signal;
   outputting the internal voltage in response to the first driving signal;
   detecting the internal voltage and outputting a second driving signal in response to an active signal; and
   controlling the first driving signal in response to the second driving signal,
   wherein the step of detecting comprises:
   dividing the internal voltage to generate a divided voltage in response to the active signal;
   inverting the active signal to generate an inverted active signal;
   inactivating with a switching transistor the second driving signal in response to the inverted active signal;
   comparing the divided voltage to the reference voltage for activating the second driving signal when the divided voltage is less than the reference voltage and for inactivating the second driving signal when the divided voltage is greater than the reference voltage.

20. The circuit of claim 5, wherein the internal voltage detecting means activates the second driving signal when the active signal is activated and the internal voltage is less than or equal to a target voltage.

21. The circuit of claim 9, wherein the voltage dividing means outputs the internal voltage when the active signal is inactivated, and divides the internal voltage to generate the divided voltage when the active signal is activated.

22. The circuit of claim 21, wherein:
   the divided voltage is less than the reference voltage when the internal voltage is less than or equal to a target voltage; and
   the divided voltage is greater than the reference voltage when the internal voltage is greater than the target voltage.

* * * * *